United States Patent
Watanabe et al.

(10) Patent No.: US 11,262,476 B2
(45) Date of Patent: Mar. 1, 2022

(54) RELAY UNIT FOR PHOTOELECTRIC SENSOR

(71) Applicant: PANASONIC INDUSTRIAL DEVICES SUNX CO., LTD., Aichi (JP)

(72) Inventors: Yoshiyuki Watanabe, Aichi (JP); Koji Ito, Aichi (JP)

(73) Assignee: PANASONIC INDUSTRIAL DEVICES SUNX CO., LTD., Aichi (JP)

( * ) Notice: Subject to any disclaimer, the term of this patent is extended or adjusted under 35 U.S.C. 154(b) by 34 days.

(21) Appl. No.: 16/970,237

(22) PCT Filed: Jan. 23, 2019

(86) PCT No.: PCT/JP2019/002139
§ 371 (c)(1),
(2) Date: Aug. 14, 2020

(87) PCT Pub. No.: WO2019/187557
PCT Pub. Date: Oct. 3, 2019

(65) Prior Publication Data
US 2021/0003740 A1     Jan. 7, 2021

(30) Foreign Application Priority Data
Mar. 30, 2018  (JP) .............................. JP2018-069497

(51) Int. Cl.
*G01V 8/20*        (2006.01)
*H03K 17/94*       (2006.01)

(52) U.S. Cl.
CPC .............. *G01V 8/20* (2013.01); *H03K 17/943* (2013.01)

(58) Field of Classification Search
CPC ......... G01V 8/20; H03K 17/78; H03K 17/943
See application file for complete search history.

(56) References Cited

U.S. PATENT DOCUMENTS

2003/0215235 A1*  11/2003  Norizuki ............. H04B 10/275
                                                        398/59
2005/0052639 A1    3/2005  Hartl

FOREIGN PATENT DOCUMENTS

JP          2958371 B2    10/1999
JP       2002-296361 A    10/2002
                    (Continued)

OTHER PUBLICATIONS

International Search Report issued in Patent No. PCT/JP2019/002139 dated Apr. 16, 2019.

(Continued)

*Primary Examiner* — Kevin K Pyo
(74) *Attorney, Agent, or Firm* — Pearne & Gordon LLP

(57) ABSTRACT

In a relay unit, a sensor-side communication controller acquires setting information from a synchronization line and stores the acquired setting information in a storage unit in response to reception of a backup instruction from a communication master by a master-side communication controller. The sensor-side communication controller outputs the setting information stored in the storage unit to the synchronization line via a branch line in response to reception of a restoration instruction from the communication master by the master-side communication controller. The sensor-side communication controller periodically or aperiodically compares the setting information transmitted through the synchronization line with the setting information of the storage unit so as to detect presence or absence of a difference. The master-side communication controller outputs a notification signal to the communication master in response to detection of the difference.

7 Claims, 2 Drawing Sheets

(56) References Cited

FOREIGN PATENT DOCUMENTS

| | | |
|---|---|---|
| JP | 3965926 B2 | 8/2007 |
| JP | 2008-300201 A | 12/2008 |
| JP | 5184022 B2 | 4/2013 |

OTHER PUBLICATIONS

Written Opinion issued in Patent No. PCT/JP2019/002139 dated Apr. 16, 2019.

* cited by examiner

RELAY UNIT FOR PHOTOELECTRIC SENSOR

TECHNICAL FIELD

The present invention relates to a relay unit for photoelectric sensor used by being connected between a photoelectric sensor such as a multi-optical-axis photoelectric sensor and a controller.

BACKGROUND ART

In the related art, a multi-optical-axis photoelectric sensor is known as an apparatus for detecting entry of an object into a detection area (for example, Patent Literatures 1 and 2). In the multi-optical-axis photoelectric sensor, a light emitter including a plurality of light emitting elements and a light receiver including a plurality of light receiving elements are arranged to face each other. The light emitter forms a plurality of optical axes by causing the light emitting elements to sequentially emit light. Further, the light receiving elements receive light from the facing light emitting elements and output a voltage signal (light receiving signal) in accordance with a light receiving amount thereof. Then, the light receiver detects a light-entering state and a light-blocking state of the light receiving elements based on the light receiving signal, and detects entry of the object into the detection area based on a detection result thereof. For example, in a setting device of a multi-optical-axis photoelectric sensor disclosed in Patent Literature 2, a console is connected to the multi-optical-axis photoelectric sensor, and setting data indicating a definition of various detection operations is taught from the console to the sensor, thereby preventing erroneous setting due to human error or the like.

There is a need to connect the multi-optical-axis photoelectric sensor to a communication master such as an IO-Link master that can easily retrieve and use sensor information, and to manage the sensor information of the multi-optical-axis photoelectric sensor in a control apparatus of host communication.

CITATION LIST

Patent Literature

Patent Literature 1: JP-A-2008-300201
Patent Literature 2: JP-A-2002-296361

SUMMARY OF INVENTION

Technical Problem

However, when a new signal line for outputting the sensor information to the communication master is provided, the multi-optical-axis photoelectric sensor needs to be modified, and replacing all the multi-optical-axis photoelectric sensor already installed in a facility device of a user may generate a large burden of cost.

An object of the present invention is to provide a relay unit for photoelectric sensor that satisfies a specification of a communication master and can be easily installed even after an existing facility including a photoelectric sensor is not changed.

Solution to Problem

Hereinafter, means for solving the above-described problem and functions and effects thereof will be described. A relay unit for photoelectric sensor that solves the above problems is a relay unit for photoelectric sensor that performs signal transmission between the photoelectric sensor and a communication master, the relay unit for photoelectric sensor including: a first terminal to which a cable is connected between the first terminal and the photoelectric sensor; a second terminal to which a cable is connected between the second terminal and a controller; a third terminal to which a cable is connected between the third terminal and the communication master; a synchronization line which connects the first terminal to the second terminal and through which setting information and detection information of the photoelectric sensor is transmitted; a sensor-side communication controller configured to communicate with the photoelectric sensor via a branch line that branches off from the synchronization line; a master-side communication controller configured to communicate with the communication master via the cable connected to the third terminal; and a storage unit, in which the sensor-side communication controller acquires the setting information from the synchronization line and store the acquired setting information in the storage unit in response to reception of a backup instruction from the communication master by the master-side communication controller, in which the sensor-side communication controller outputs the setting information stored in the storage unit to the synchronization line in response to reception of a restoration instruction from the communication master by the master-side communication controller, in which the sensor-side communication controller periodically or aperiodically compares the setting information transmitted through the synchronization line with the setting information of the storage unit so as to detect presence or absence of a difference, and in which the master-side communication controller outputs a notification signal to the communication master in response to detection of the difference.

According to this configuration, the sensor-side communication controller compares the setting information transmitted through the synchronization line with the setting information of the storage unit, and in response to detection of the difference, the notification signal is output from the sensor-side communication controller to the communication master. Therefore, since issuing the restoration instruction from the communication master can be stopped, it can be avoided that setting information including a difference from the setting information of the photoelectric sensor is set (restored) in the photoelectric sensor after replacement. Therefore, a relay unit that can be easily installed even after an existing facility including a photoelectric sensor is not changed and satisfies a communication specification of a communication master can be provided.

In the relay unit for photoelectric sensor, it is preferable that the sensor-side communication controller prohibit the setting information stored in the storage unit from being output to the synchronization line until the difference is resolved.

According to this configuration, since the sensor-side communication controller prohibits the setting information stored in the storage unit from being output to the synchronization line until the difference is resolved, it can be avoided that the setting information including the difference is set (restored) in the photoelectric sensor after the replacement.

In the relay unit for photoelectric sensor, it is preferable that the sensor-side communication controller notify the communication master of recovery information via the master-side communication controller in response to resolution of the difference.

According to this configuration, since the sensor-side communication controller notifies the communication master of the recovery information via the master-side communication controller in response to resolution of the difference, the restoration instruction can be issued after confirming that there is no difference in the setting information of the storage unit.

In the relay unit for photoelectric sensor, it is preferable that the sensor-side communication controller be configured to prohibit, by authentication data, a function of outputting the setting information stored in the storage unit to the synchronization line together with the update flag, and the restoration instruction and the backup instruction from the communication master not be accepted during the prohibition.

According to this configuration, the sensor-side communication controller can prohibit, by the authentication data, the function of outputting the setting information stored in the storage unit to the synchronization line together with the update flag. During the prohibition, the restoration instruction and the backup instruction from the communication master are not accepted. Therefore, it can be avoided that an unauthorized person who does not know the authentication data such as a password issues the backup instruction and stores (saves) the setting information in the storage unit, and issues the restoration instruction and updates the setting information of the photoelectric sensor.

The relay unit for photoelectric sensor preferably further includes (i) the transceiver configured to convert the setting information acquired via the branch line into a format interpretable by the sensor-side communication controller, and (ii) the isolation unit that separately arranges a safety-related circuit and a non-safety-related circuit to isolate the safety-related circuit from the non-safety-related circuit, the safety-related circuit including the synchronization line, the branch line, and the transceiver, the non-safety-related circuit including the sensor-side communication controller and the master-side communication controller.

According to this configuration, noise from the non-safety-related circuit can be effectively prevented from being superimposed on the safety-related circuit. Therefore, when the backup instruction is received, the setting information transmitted through the synchronization line can be correctly saved in the storage unit, or when the restoration instruction is received, the setting information of the storage unit can be correctly output to the synchronization line.

In the relay unit for photoelectric sensor, the communication master is preferably an IO-Link master.

According to this configuration, sensor information of the photoelectric sensor can be acquired by IO-Link communication, and a situation of the photoelectric sensor can be monitored.

In the relay unit for photoelectric sensor, the following is preferable. The relay unit for photoelectric sensor that performs signal transmission between the photoelectric sensor and a communication master, the relay unit for photoelectric sensor including: a first terminal to which a cable is connected between the first terminal and the photoelectric sensor; a second terminal to which a cable is connected between the second terminal and the controller; a third terminal to which a cable is connected between the third terminal and the communication master; a synchronization line which connects the first terminal to the second terminal and through which setting information and detection information of the photoelectric sensor is transmitted; a sensor-side communication controller configured to communicate with the photoelectric sensor via a branch line that branches off from the synchronization line; a master-side communication controller connected to and configured to communicate with the sensor-side communication controller and configured to communicate with the communication master via the cable connected to the third terminal; and a storage unit, in which the sensor-side communication controller acquires the setting information from the synchronization line and store the acquired setting information in the storage unit in response to reception of a backup instruction from the communication master by the master-side communication controller, in which the sensor-side communication controller outputs the setting information stored in the storage unit to the synchronization line via the branch line in response to reception of a restoration instruction from the communication master by the master-side communication controller, in which the sensor-side communication controller periodically or aperiodically compares the setting information transmitted through the synchronization line with the setting information of the storage unit so as to detect presence or absence of a difference, and in which the setting information transmitted through the synchronization line is stored in the storage unit in response to detection of the difference.

According to this configuration, the sensor-side communication controller periodically or aperiodically compares the setting information transmitted through the synchronization line with the setting information of the storage unit so as to detect presence or absence of a difference. In response to detection of the difference, the sensor-side communication controller stores the setting information transmitted through the synchronization line in the storage unit. Therefore, correct setting information that is not different from the setting information of the photoelectric sensor can be saved in the storage unit of the relay unit.

Advantageous Effects of Invention

According to the relay unit for photoelectric sensor in the present disclosure, the specification of the communication master can be satisfied, and easy installation can be performed even after the existing facility including the photoelectric sensor is not changed.

DESCRIPTION OF EMBODIMENTS

Figure 1:
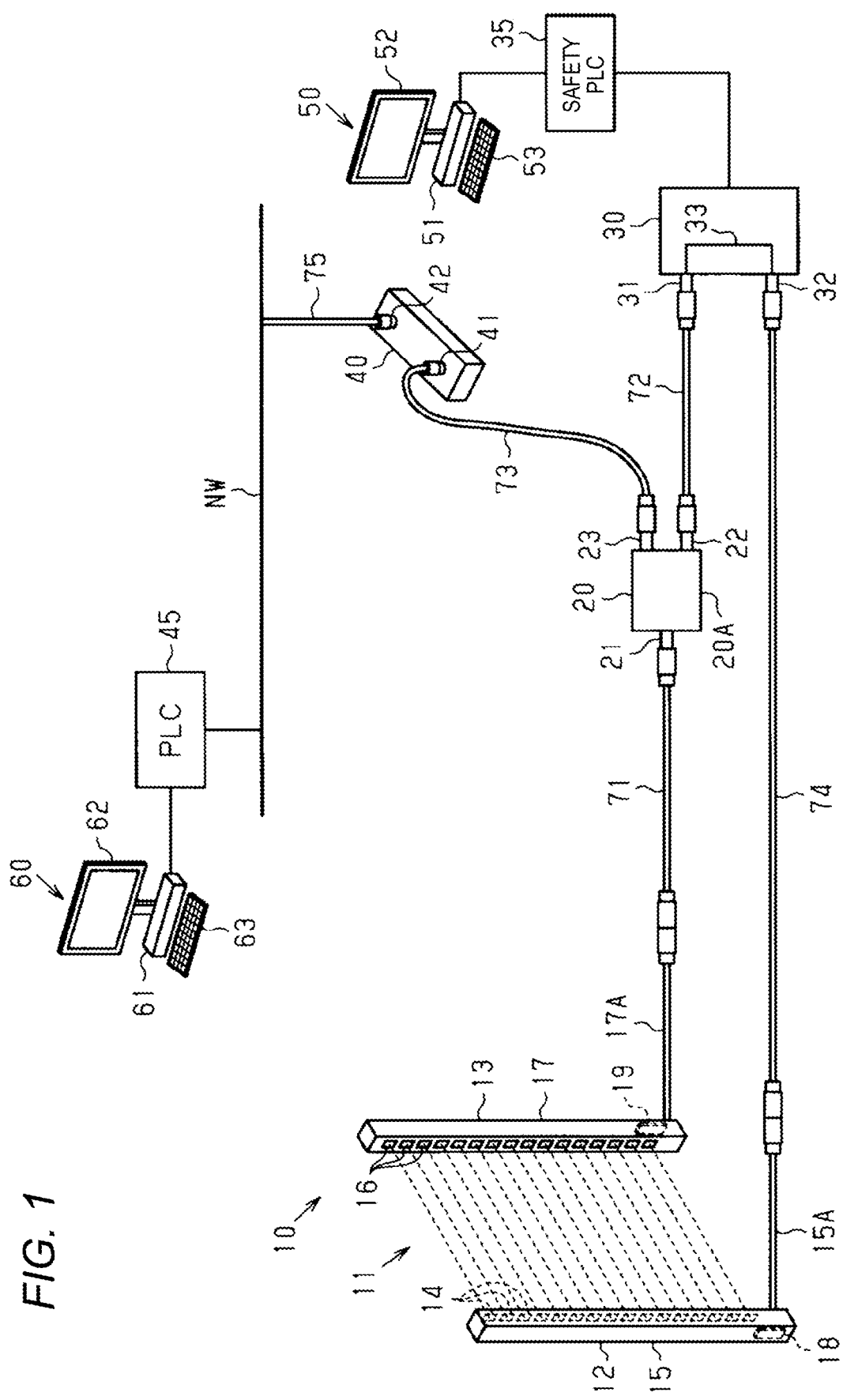
FIG. 1 is a schematic diagram showing a light curtain system according to an embodiment.

Hereinafter, an embodiment will be described with reference to the accompanying drawings. As shown in FIG. 1, a light curtain system 10 includes a light curtain 11 including multi-optical-axis photoelectric sensors 12 and 13 that are an example of a photoelectric sensor, a relay unit for photoelectric sensor 20, a controller 30, and a communication master 40. One multi-optical-axis photoelectric sensor 12 that constitutes the light curtain 11 is a light emitter 15 having a plurality of light emitting elements 14 arranged in a line in a longitudinal direction thereof. Further, the other multi-optical-axis photoelectric sensor 13 is a light receiver 17 having a plurality of light receiving elements 16 arranged in a line in a longitudinal direction thereof. The light emitter 15 and the light receiver 17 are arranged at positions facing each other with a predetermined detection region sandwiched therebetween such that the plurality of light emitting elements 14 and the plurality of light receiving elements 16 are paired with each other so as to form a plurality of light beams L. During operation of the light curtain 11, when an object including an operator crosses the plurality of light beams L emitted from the plurality of light emitting elements 14 toward the plurality of light receiving elements 16, the object is detected. The light emitter 15 includes a control circuit 18 that performs various controls including a light emission control of the plurality of light emitting elements 14. Further, the light receiver 17 includes a control circuit 19 that performs various controls including a light receiving control of the plurality of light receiving elements 16. A cable 15A that has a predetermined length and is electrically connected to the control circuit 18 extends from a lower portion of the light emitter 15. Further, a cable 17A that has a predetermined length and is electrically connected to the control circuit 19 extends from a lower portion of the light receiver 17.

The relay unit 20 includes a rectangular parallelepiped main body 20A and three terminals 21 to 23 provided on the main body 20A. The controller 30 includes a first terminal 31 and a second terminal 32. The communication master 40 includes a first terminal 41 and a second terminal 42. One end portion of a cable 71 is connected to the cable 17A that extends from the other multi-optical-axis photoelectric sensor 13, for example, the lower portion of the light receiver 17. The other end portion of the cable 71 is connected to the first terminal 21 of the relay unit 20. One end portion of a cable 72 is connected to the first terminal 31 of the controller 30. The other end portion of the cable 72 is connected to the second terminal 22 of the relay unit 20. Further, one end portion of a cable 73 is connected to the communication master 40. The other end portion of the cable 73 is connected to the third terminal 23 of the relay unit 20. One end portion of a cable 74 is connected to the cable 15A that extends from one multi-optical-axis photoelectric sensor 12, for example, the lower portion of the light emitter 15. The other end portion of the cable 74 is connected to the second terminal 32 of the controller 30.

In this way, the light emitter 15 and the light receiver 17 are electrically connected via the cables 17A, 71, and 72, a synchronization line 33 in the controller 30, and the cables 74 and 15A. The controller 30 controls the light emitter 15 and the light receiver 17 in synchronization with each other. Further, the controller 30 is connected to a safety programmable logic controller (PLC) 35 via a cable. The safety PLC 35 is connected to a main body 51 of a personal computer 50 (hereinafter, simply referred to as "PC 50"). A user operates an input apparatus 53 such as a keyboard and a mouse while seeing a setting screen of a monitor 52, so that safety-related setting information can be set from the PC 50 to the light emitter 15 and the light receiver 17 via the controller 30, or safety-related information can be displayed on the monitor 52.

The communication master 40 is an IO-Link master. In this example, the multi-optical-axis photoelectric sensors 12 and 13, that is, the light emitter 15 and the light receiver 17 are IO-Link devices. The cable 73 that connects the relay unit 20 and the communication master 40 is an IO-Link cable. The cable 73 is connected to the first terminal 41. The communication master 40 is connected to a host network NW via a cable 75 having one end portion connected to the second terminal 42. A programmable logic controller (PLC) 45 is connected to the host network NW. The PLC 45 is connected to a main body 61 of a personal computer 60 (hereinafter, also simply referred to as "PC 60"). The PC 60 is installed in, for example, a security room. The user operates the input apparatus 63 while seeing a setting screen of a monitor 62 so as to set various pieces of setting information from the PC 60 to the light receiver 17 via the communication master 40. Further, by operating the input apparatus 63, various instructions including a backup instruction and a restoration instruction can be given to the relay unit 20. Furthermore, in the security room or the like, a situation in a field of the light curtain 11 is displayed almost in real time while seeing the monitor 62 of the PC 60. Specifically, the communication master 40 acquires various pieces of sensor information such as general information, device information (maker, product number), light amount information, and error information from the relay unit 20 via the cable 73, and sends the acquired sensor information to the PC 60 via the PLC 45 on the host network NW. On the monitor 62 of the PC 60, the sensor information is displayed almost in real time in a predetermined display mode such as being graphed as appropriate.

When the setting information used in the multi-optical-axis photoelectric sensors 12 and 13 is replaced by at least one of the multi-optical-axis photoelectric sensors 12 and 13, the relay unit 20 according to the present embodiment has a function of taking over the setting information of the multi-optical-axis photoelectric sensors 12 and 13 before the replacement and setting the taken over setting information in the multi-optical-axis photoelectric sensors after the replacement in accordance with the restoration instruction from the communication master 40.

Figure 2:
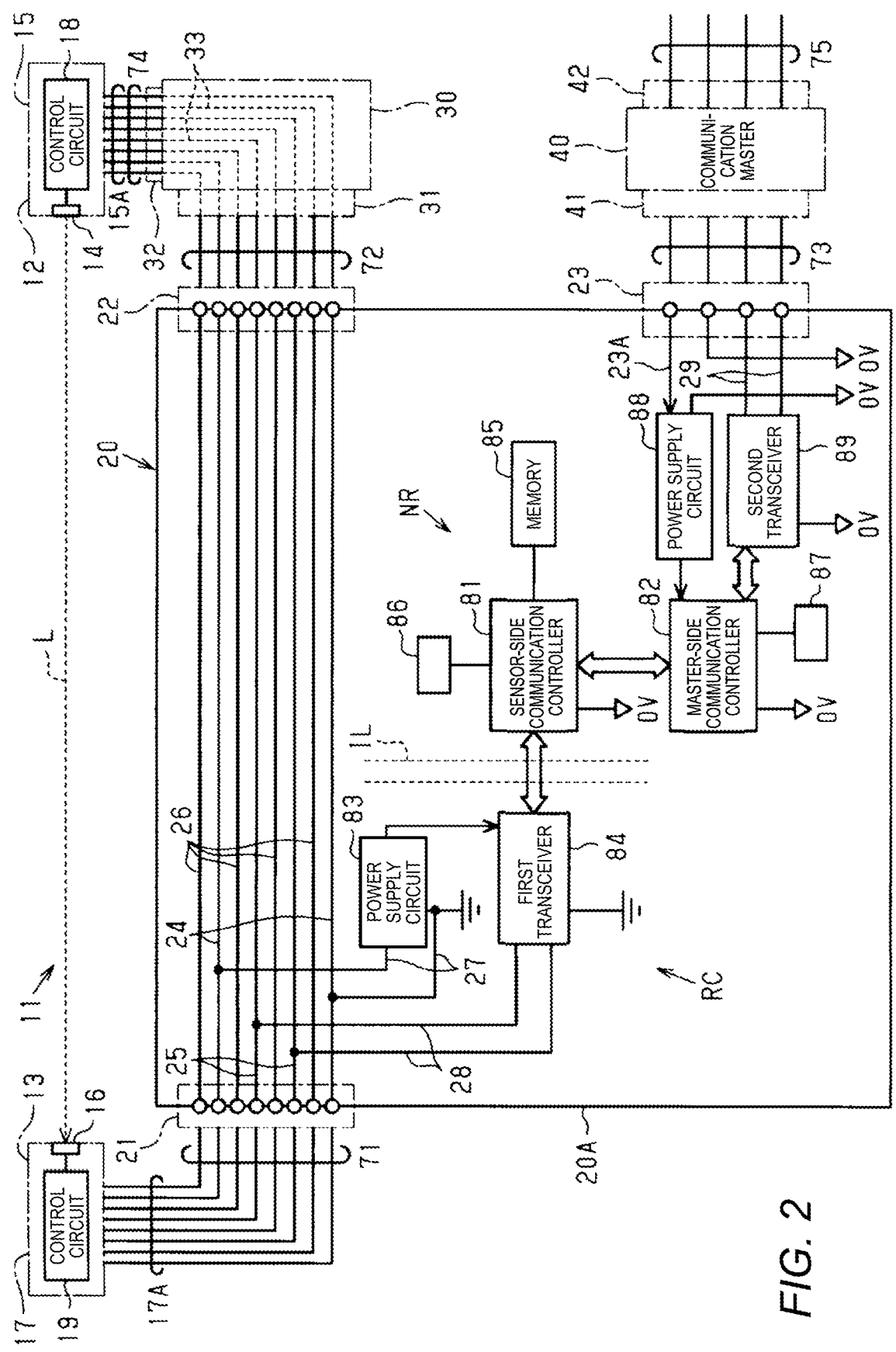
FIG. 2 is a circuit configuration diagram of a relay unit.

Next, a detailed configuration of the relay unit 20 will be described with reference to FIG. 2. As shown in FIG. 2, in the relay unit 20, the first terminal 21 and the second terminal 22 are connected by two power supply lines 24 to which a power supply voltage for supplying electric power and 0V are respectively supplied, by two synchronization lines 25 through which the setting information and detection information of the multi-optical-axis photoelectric sensors 12 and 13 are transmitted, and by four control output lines 26.

The relay unit 20 is provided with a sensor-side communication controller 81 that mainly communicates with the multi-optical-axis photoelectric sensor 13 and a master-side communication controller 82 that communicates with the communication master 40. The sensor-side communication controller 81 and the master-side communication controller 82 are connected to and configured to communicate with each other. Examples of the setting information transmitted to the synchronization lines 25 include setting information on muting, blanking, interlock, external device monitor, application display lamp, protection, and the like. The detection information is information indicating a detection result when the light curtain 11 detects presence or absence of an object.

Here, since the setting information of the multi-optical-axis photoelectric sensors 12 and 13 is safety-related information, it is necessary to conform to a safety standard. However, since the IO-Link communication itself does not conform to the safety standard, it is difficult to use the cable 73 for transmitting the setting information. Therefore, in the present embodiment, the relay unit 20 is provided with a memory 85 that is an example of a storage unit. The setting information is transmitted between the multi-optical-axis photoelectric sensors 12 and 13 and the relay unit 20.

A setting change of the setting information cannot be performed from the communication master 40 because of a safety standard problem. Therefore, the setting change of the setting information is performed on a controller 30 side. If the relay unit 20 does not know that setting has been changed, a difference occurs between setting information stored by the relay unit 20 and the setting information set in the multi-optical-axis photoelectric sensors 12 and 13, and erroneous setting information is restored during restoration. In order to prevent this, the relay unit 20 constantly monitors the setting information on the synchronization lines 25, notifies a communication master 40 side when there is a change, and receives the backup instruction from the communication master 40. Thereby, backup and correction are made to obtain correct setting information.

As shown in FIG. 2, the relay unit 20 includes a power supply circuit 83 and a first transceiver 84. In two branch lines 27, which branch off and extend from the two power supply lines 24, one line on a power supply voltage side is connected to the power supply circuit 83, and the other line on a 0V side is grounded. Further, two branch lines 28 that branch off and extend from the two synchronization lines 25 are connected to the first transceiver 84. The first transceiver 84 is connected to and configured to communicate with the sensor-side communication controller 81. Further, the memory 85 is connected to the sensor-side communication controller 81. Furthermore, the power supply circuit 83 and the first transceiver 84 are insulated and separated from the sensor-side communication controller 81 and the memory 85 by an isolation unit IL. Specifically, in the relay unit 20, a safety-related circuit RC and a non-safety-related circuit NR are separately arranged, and the isolation unit IL for electrically insulating (isolating) the safety-related circuit RC and the non-safety-related circuit NR is provided. Here, the safety-related circuit RC includes the first transceiver 84, the power supply lines 24, the synchronization lines 25, the control output lines 26, and the like. Further, the non-safety-related circuit NR includes the sensor-side communication controller 81, the master-side communication controller 82, a second transceiver 89, and the like. When an electrical noise is superimposed on the non-safety-related circuit NR, if the noise affects the safety-related circuit RC, conforming to the safety standard by the non-safety-related circuit NR is affected. Therefore, the safety-related circuit RC related to safety is isolated from the non-safety-related circuit NR.

An oscillation circuit 86 is connected to the sensor-side communication controller 81. Further, an oscillation circuit 87 is connected to the master-side communication controller 82. The relay unit 20 includes a power supply circuit 88 that converts a voltage supplied from the third terminal 23 via a power supply line 23A into a predetermined voltage, and the second transceiver 89 interposed between the third terminal 23 and the master-side communication controller 82. A voltage from the power supply circuit 88 is supplied to the sensor-side communication controller 81, the master-side communication controller 82, and the second transceiver 89. The second transceiver 89 has a function of converting the detection information and the like from the master-side communication controller 82 into a format that the communication master 40 can handle and conversely converting an instruction and information from the communication master 40 into a format that the master-side communication controller 82 can handle. Further, in the example shown in FIG. 2, the third terminal 23 is a 4-pin connector. The third terminal 23 and the second transceiver 89 are connected by two communication lines 29.

The sensor-side communication controller 81 may communicate with the multi-optical-axis photoelectric sensor 13 via the first transceiver 84. The sensor-side communication controller 81 stores the setting information acquired from the synchronization lines 25 via the branch lines 28 in the memory 85. In a stipulation of an IO-Link communication protocol, when the setting information is saved and the multi-optical-axis photoelectric sensors 12 and 13 that are devices are replaced, it is necessary to save the setting information on a communication master 40 side such that the setting information can be taken over by the multi-optical-axis photoelectric sensors 12 and 13 after the replacement. However, the multi-optical-axis photoelectric sensors 12 and 13 cannot send the setting information to an external device that does not conform to the safety standard for a safety reason.

The setting information of the multi-optical-axis photoelectric sensors 12 and 13 may be changed via the safety PLC 35 and the controller 30 by an operation of the user from the PC 50 connected to the safety PLC 35. In this case, the communication master 40 cannot know that the setting information set in the multi-optical-axis photoelectric sensors 12 and 13 has been changed. Therefore, in the present embodiment, the relay unit 20 manages the setting information.

The sensor-side communication controller 81 shown in FIG. 2 periodically acquires the setting information transmitted through the synchronization lines 25, and compares the acquired setting information with the setting information of the memory 85 so as to detect presence or absence of a difference. When the difference is detected, the master-side communication controller 82 outputs a notification signal to the communication master 40. A timing may be aperiodic at which the master-side communication controller 82 executes the processing of comparing the setting information transmitted through the synchronization lines 25 with the setting information of the memory 85.

When the master-side communication controller 82 receives the backup instruction from the communication master 40, the sensor-side communication controller 81 acquires the setting information from the synchronization lines 25 and stores the acquired setting information in the memory 85. Further, when the master-side communication controller 82 receives the restoration instruction from the communication master 40, the sensor-side communication controller 81 has a function of outputting the setting information of the memory 85 to the synchronization lines 25. Specifically, the sensor-side communication controller 81 has a function of outputting the setting information of the memory 85 to the synchronization lines 25 together with an update flag. However, when the setting information of the memory 85 includes a difference, the sensor-side communication controller 81 prohibits the setting information of the memory 85 from being output to the synchronization lines 25 until the difference is resolved.

When the setting information of the memory 85 and the setting information acquired from the synchronization lines 25 are compared and the difference is resolved, the sensor-side communication controller 81 notifies the communication master 40 of recovery information via the master-side communication controller 82. Therefore, the recovery information from the communication master 40 is displayed on the monitor 62 of the PC 60 as text or an image.

The sensor-side communication controller 81 may prohibit the function of outputting the setting information stored in the memory 85 to the synchronization lines 25 together with the update flag by a password. The sensor-side communication controller 81 does not accept an update command signal based on the restoration instruction and a save command signal based on the backup instruction from the communication master 40 during the prohibition.

Next, functions of the light curtain system 10 including the relay unit 20 will be described.

The user can issue the backup instruction and the restoration instruction from the PC 60 by operating the input apparatus 63 while seeing the setting screen of the monitor 62 of the PC 60. The computer in the PC 60 executes software stored in the memory (neither shown) so as to display the setting screen (not shown) on the monitor 62. A desired instruction is selected from selection options related to instructions on the setting screen by operating the input apparatus 63 such as the mouse, thereby issuing the backup instruction or the restoration instruction. Further, on the monitoring setting screen of the monitor 62, sensor information on a situation of the multi-optical-axis photoelectric sensors 12 and 13 is displayed almost in real time. Further, if the setting screen of the monitor 62 is switched, the setting information or the like is also displayed.

The user operates the input apparatus 63 while seeing the setting screen of the monitor 62, thereby setting various pieces of setting information from the PC 60 to the multi-optical-axis photoelectric sensors 12 and 13 (the light emitter 15 and the light receiver 17) via the communication master 40. Further, the user may operate the input apparatus 53 of the PC 50 connected to the safety PLC 35 so as to change the setting information of the multi-optical-axis photoelectric sensors 12 and 13 via the controller 30. In this case, the communication master 40 cannot know that the setting information set in the multi-optical-axis photoelectric sensors 12 and 13 has been changed.

The user operates the input apparatus 63 of the PC 60 so as to set the password. The sensor-side communication controller 81 prohibits, by the password, the function of outputting the setting information of the memory 85 to the synchronization lines 25 together with the update flag. Further, the sensor-side communication controller 81 prohibits, by the password, a function of writing and saving the setting information transmitted through the synchronization lines 25 in the memory 85. The sensor-side communication controller 81 does not accept the update command signal based on the restoration instruction and the save command signal based on the backup instruction from the communication master 40 during the prohibition.

During operation of the light curtain 11, the setting information and the detection information are transmitted to the synchronization lines 25. The sensor-side communication controller 81 periodically compares the setting information transmitted through the synchronization lines 25 with the setting information of the memory 85 so as to detect presence or absence of a difference. When the difference is detected, the master-side communication controller 82 outputs the notification signal to the communication master 40. The notification signal is transmitted from the communication master 40 to the PC 60, and notification information is displayed on the monitor 62 of the PC 60. The user who sees the notification information operates the input apparatus 63 of the PC 60 so as to input the password, and then issues the backup instruction. The backup instruction is sent from the communication master 40 to the relay unit 20.

The master-side communication controller 82 receives the backup instruction and the password from the communication master 40. At this time, the second transceiver 89 converts the password and the backup instruction into a data format that can be interpreted by the sensor-side communication controller 81 and the master-side communication controller 82. The sensor-side communication controller 81 authenticates the password, and accepts the save command signal based on the backup instruction when the password is authenticated. The sensor-side communication controller 81 acquires the setting information from the synchronization lines 25 and saves the acquired setting information in the memory 85. When the setting information of the memory 85 and the setting information acquired from the synchronization lines 25 are compared and the difference is resolved, the sensor-side communication controller 81 notifies the communication master 40 of the recovery information via the master-side communication controller 82. Since the communication master 40 sends the recovery information to the host PC 60, the recovery information is displayed on the monitor 62. The user who sees the recovery information on the monitor 62 confirms that the correct setting information has been backed up.

For example, when the multi-optical-axis photoelectric sensors 12 and 13 are replaced with new ones, the user operates the input apparatus 63 of the PC 60 so as to input the password, and then issues the restoration instruction. For example, after confirming the recovery information on the monitor 62, the user operates the input apparatus 63 so as to issue the restoration instruction. The restoration instruction is sent to the relay unit 20 via the communication master 40.

In the relay unit 20, the master-side communication controller 82 receives the restoration instruction and the password from the communication master 40. At this time, the second transceiver 89 converts the password and the restoration instruction into a data format that can be interpreted by the sensor-side communication controller 81 and the master-side communication controller 82. When the password is authenticated, the sensor-side communication controller 81 accepts the update command signal based on the restoration instruction, and outputs the setting information of the memory 85 to the synchronization lines 25 together with the update flag. That is, after the setting information is converted by the first transceiver 84 into a data format that can be interpreted by the control circuits 18 and 19 of the multi-optical-axis photoelectric sensors 12 and 13, the converted setting information is transmitted from the first transceiver 84 to the multi-optical-axis photoelectric sensors 12 and 13 via the branch lines 28 and the synchronization lines 25. When accepting the setting information and the update flag, the control circuits 18 and 19 of the multi-optical-axis photoelectric sensors 12 and 13 set the accepted setting information in the memory (not shown) by writing. However, when the setting information of the memory 85 includes a difference, the sensor-side communication controller 81 prohibits the setting information of the memory 85 from being output to the synchronization lines 25 until the difference is resolved. Then, when the difference is resolved by the subsequent update of the setting information of the memory 85 based on the backup instruction, the setting information of the memory 85 is output to the synchronization lines 25 together with the update flag, and the setting information is set in the multi-optical-axis photoelectric sensors 12 and 13 after the replacement. In this way, the multi-optical-axis photoelectric sensors 12 and 13 after the replacement are restored to the same setting state as that of the multi-optical-axis photoelectric sensors 12 and 13 before the replacement. When the password is not authenticated, the sensor-side communication controller 81 does not accept the update command signal based on the restoration instruction. Further, when the master-side communication controller 82 performs an authentication processing of the password and the password is not authenticated, a command signal related to saving or updating to the sensor-side communication controller 81 may not be output.

As described above, according to the present embodiment, the following effects can be obtained.

(1) The relay unit 20 includes the first terminal 21 to which the cable 71 is connected between the first terminal 21 and the multi-optical-axis photoelectric sensor 13, the second terminal 22 to which the cable 72 is connected between the second terminal 22 and the controller 30, and the third terminal 23 to which the cable 73 is connected between the third terminal 23 and the communication master 40. Further, the relay unit 20 includes the sensor-side communication controller 81 that can communicate with the multi-optical-axis photoelectric sensor 13 via the branch lines 28 that branch off from the synchronization lines 25, the master-side communication controller 82 that communicates with the communication master 40 via the cable 73 connected to the third terminal 23 and that is connected to and configured to communicate with the sensor-side communication controller 81, and the memory 85. When the master-side communication controller 82 receives the backup instruction from the communication master 40, the sensor-side communication controller 81 acquires the setting information from the synchronization lines 25 and stores the acquired setting information in the memory 85. When the master-side communication controller 82 receives the restoration instruction from the communication master 40, the sensor-side communication controller 81 outputs the setting information of the memory 85 to the synchronization lines 25 via the branch lines 28. The sensor-side communication controller 81 periodically or aperiodically compares the setting information transmitted through the synchronization lines 25 with the setting information of the memory 85, and when a difference is detected, the master-side communication controller 82 outputs the notification signal to the communication master 40. Therefore, when the sensor-side communication controller 81 detects the difference between the setting information transmitted through the synchronization lines 25 and the setting information of the memory 85, the notification signal is output from the sensor-side communication controller 81 to the communication master 40. Therefore, since issuing the restoration instruction from the communication master 40 can be stopped, it can be avoided that setting information including a difference from setting information set in the multi-optical-axis photoelectric sensors 12 and 13 before the replacement is set (restored) in the multi-optical-axis photoelectric sensors 12 and 13 after the replacement. Therefore, it is possible to provide the relay unit 20 that satisfies a specification of the communication master 40 and can be easily installed even after an existing facility such as the light curtain system 10 including the multi-optical-axis photoelectric sensors 12 and 13 is not changed.

(2) The sensor-side communication controller 81 prohibits the setting information stored in the memory 85 from being output to the synchronization lines 25 until the difference is resolved. Therefore, since the sensor-side communication controller 81 prohibits the setting information stored in the memory 85 from being output to the synchronization lines 25 until the difference is resolved, it can be avoided that the setting information including the difference is set (restored) in the multi-optical-axis photoelectric sensors 12 and 13 after the replacement.

(3) When the difference is resolved, the sensor-side communication controller 81 notifies the communication master 40 of the recovery information via the master-side communication controller 82. Therefore, since the sensor-side communication controller 81 notifies the communication master 40 of the recovery information via the master-side communication controller 82 when the difference is resolved, the user can issue the restoration instruction after confirming that there is no difference.

(4) The sensor-side communication controller 81 prohibits, by the password, the function of outputting the setting information stored in the memory 85 to the synchronization lines 25 together with the update flag. During the prohibition, the update command signal based on the restoration instruction and the save command signal based on the backup instruction from the communication master 40 are not accepted. Therefore, the sensor-side communication controller 81 can prohibit, by the password, the function of outputting the setting information of the memory 85 to the synchronization lines 25 together with the update flag. During the prohibition, the restoration instruction and the backup instruction from the communication master 40 are not accepted. Therefore, it can be avoided that an unauthorized person issues the backup instruction so as to store (save) the setting information in the memory 85 and issues the restoration instruction so as to update the setting information of the multi-optical-axis photoelectric sensors 12 and 13.

(5) The relay unit 20 includes the first transceiver 84 that converts the setting information acquired via the branch lines 28 into a format that can be interpreted by the sensor-side communication controller 81. The relay unit 20 includes the isolation unit IL that separately arranges the safety-related circuit RC including the synchronization lines 25, the branch lines 28, and the first transceiver 84 and the non-safety-related circuit NR including the sensor-side communication controller 81 and the master-side communication controller 82, and that electrically isolates the safety-related circuit RC from the non-safety-related circuit NR. Therefore, noise from the non-safety-related circuit NR can be effectively prevented from being superimposed on the safety-related circuit RC. Therefore, when the backup instruction is received, the setting information transmitted through the synchronization lines 25 can be correctly saved in the memory 85, or when the restoration instruction is received, the setting information of the memory 85 can be correctly output to the synchronization lines 25.

(6) The communication master 40 is an IO-Link master. Therefore, the communication master 40 can easily acquire the sensor information of the multi-optical-axis photoelectric sensors 12 and 13 via the relay unit 20 by IO-Link communication, and can monitor a situation of the multi-optical-axis photoelectric sensors 12 and 13 based on the acquired sensor information.

(7) The sensor-side communication controller 81 compares the setting information transmitted through the synchronization lines 25 with the setting information of the memory 85 so as to detect presence or absence of the difference. When the difference is detected, the sensor-side communication controller 81 stores the setting information transmitted through the synchronization lines 25 in the memory 85. Therefore, the correct setting information that is not different from the setting information of the multi-optical-axis photoelectric sensors 12 and 13 can be saved in the memory 85 of the relay unit 20.

The above-described embodiment can have the following aspects.

In the above-described embodiment, the relay unit 20 may automatically perform a backup processing and a restoration processing instead of a configuration of performing backup and restoration in accordance with an instruction from a host (user). For example, if the sensor-side communication controller 81 in the relay unit 20 detects a difference of the setting information, the setting information transmitted through the synchronization lines 25 is acquired via the branch lines 28, and the acquired setting information is written in the memory 85, thereby automatically updating the setting information of the memory 85. In this case, the restoration instruction may be an instruction from a host. Further, when detecting replacement of at least one of the multi-optical-axis photoelectric sensors 12 and 13, the communication master 40 sends the restoration instruction to the relay unit 20. The sensor-side communication controller 81 outputs the setting information of the memory 85 to the synchronization lines 25 via the branch lines 28 together with the update flag, and sets the setting information in the multi-optical-axis photoelectric sensors 12 and 13 after the replacement, in accordance with the restoration instruction from the communication master 40. Alternatively, when the sensor-side communication controller 81 in the relay unit 20 detects replacement of at least one of the multi-optical-axis photoelectric sensors 12 and 13, the sensor-side communication controller 81 outputs the setting information of the memory 85 to the synchronization lines 25 via the branch lines 28 together with the update flag, and sets the setting information in the multi-optical-axis photoelectric sensors 12 and 13 after the replacement. Accordingly, the multi-optical-axis photoelectric sensors 12 and 13 after the replacement are automatically restored to the same setting state as that of the multi-optical-axis photoelectric sensors 12 and 13 before the replacement.

The relay unit 20 may be connected between the light emitter 15 and the controller 30. In short, the relay unit 20 may be connected between one of the pair of multi-optical-axis photoelectric sensors 12 and 13 and the controller 30.

The acceptance of the backup instruction and the restoration instruction in the relay unit 20 may not be prohibited by the password.

The communication master 40 is not limited to the IO-Link master. The communication master 40 may be a communication master based on other communication standards.

Authentication data is not limited to the password. The authentication data may be fingerprint authentication data, iris authentication data, face authentication data, or voiceprint authentication data. In short, it is only necessary to authenticate that a person is authorized.

The photoelectric sensors are not limited to the multi-optical-axis photoelectric sensors 12 and 13. The photoelectric sensors may be one-optical-axis photoelectric sensors.

Although the cables 71 and 72 each have eight cores and the number of wires that connect the first terminal 21 to the second terminal 22 is eight, cables each having another number of cores such as twelve cores may be used and the number of wires that connect the first terminal 21 to the second terminal 22 may be twelve.

A part of the above-described embodiment and the above-described modification may be replaced with a publicly known configuration as appropriate. Further, a part of or all of the above-described embodiment and the above-described modification may be combined with another modification as appropriate.

The present application is based on a Japanese patent application (Japanese Patent Application No. 2018-069497) filed on Mar. 30, 2018, the contents of which are incorporated herein by reference.

REFERENCE SIGNS LIST

10: light curtain system
11: light curtain
12, 13: multi-optical-axis photoelectric sensor (an example of a photoelectric sensor)
14: light emitting element
15: light emitter
15A: cable
16: light receiving element
17: light receiver
17A: cable
20: relay unit
21: first terminal
22: second terminal
23: third terminal
25: synchronization line
28: branch line
30: controller
31: first terminal
32: second terminal
33: synchronization line
40: communication master
41: first terminal
42: second terminal
50: PC
51: main body
52: monitor
53: input apparatus
60: PC
61: main body
62: monitor
63: input apparatus
71: cable
72: cable
73: cable
74: cable
81: sensor-side communication controller
82: master-side communication controller
83: power supply circuit
84: first transceiver (an example of a transceiver)
85: memory (an example of a storage unit)
88: power supply circuit
89: second transceiver
RC: safety-related circuit
NR: non-safety-related circuit
IL: isolation unit

What is claimed is:

1. A relay unit for photoelectric sensor that performs signal transmission between a photoelectric sensor and a communication master, the relay unit for photoelectric sensor comprising:
a first terminal to which a first cable is connected between the first terminal and the photoelectric sensor;
a second terminal to which a second cable is connected between the second terminal and a controller;
a third terminal to which a third cable is connected between the third terminal and the communication master;
a synchronization line which connects the first terminal to the second terminal and through which setting information and detection information of the photoelectric sensor is transmitted;
a sensor-side communication controller configured to communicate with the photoelectric sensor via a branch line that branches off from the synchronization line;

a master-side communication controller connected to and configured to communicate with the sensor-side communication controller and configured to communicate with the communication master via the third cable connected to the third terminal; and a storage unit, wherein the sensor-side communication controller acquires the setting information from the synchronization line and store the acquired setting information in the storage unit in response to reception of a backup instruction from the communication master by the master-side communication controller, wherein the sensor-side communication controller outputs the setting information stored in the storage unit to the synchronization line via the branch line in response to reception of a restoration instruction from the communication master by the master-side communication controller, wherein the sensor-side communication controller periodically or aperiodically compares the setting information transmitted through the synchronization line with the setting information of the storage unit so as to detect presence or absence of a difference, and wherein the master-side communication controller outputs a notification signal to the communication master in response to detection of the difference.

2. The relay unit for photoelectric sensor according to claim 1, wherein the sensor-side communication controller prohibits the setting information stored in the storage unit from being output to the synchronization line until the difference is resolved.

3. The relay unit for photoelectric sensor according to claim 1, wherein the sensor-side communication controller notifies the communication master of recovery information via the master-side communication controller in response to resolution of the difference.

4. The relay unit for photoelectric sensor according to claim 1, wherein the sensor-side communication controller is configured to prohibit, by authentication data, a function of outputting the setting information stored in the storage unit to the synchronization line together with an update flag, and wherein the backup instruction and the restoration instruction from the communication master are not accepted during prohibition.

5. The relay unit for photoelectric sensor according to claim 1, further comprising:

a transceiver configured to convert the setting information acquired via the branch line into a format interpretable by the sensor-side communication controller; and an isolation unit configured to separately arrange a safety-related circuit and a non-safety-related circuit to electrically isolate the safety-related circuit from the non-safety-related circuit, the safety-related circuit comprising the synchronization line, the branch line, and the transceiver, the non-safety-related circuit comprising the sensor-side communication controller and the master-side communication controller.

6. The relay unit for photoelectric sensor according to claim 1, wherein the communication master is an IO-Link master.

7. A relay unit for photoelectric sensor that performs signal transmission between a photoelectric sensor and a communication master, the relay unit for photoelectric sensor comprising:

a first terminal to which a first cable is connected between the first terminal and the photoelectric sensor;

a second terminal to which a second cable is connected between the second terminal and a controller;

a third terminal to which a third cable is connected between the third terminal and the communication master;

a synchronization line which connects the first terminal to the second terminal and through which setting information and detection information of the photoelectric sensor is transmitted;

a sensor-side communication controller configured to communicate with the photoelectric sensor via a branch line that branches off from the synchronization line;

a master-side communication controller connected to and configured to communicate with the sensor-side communication controller and configured to communicate with the communication master via the third cable connected to the third terminal; and a storage unit, wherein the sensor-side communication controller acquires the setting information from the synchronization line and store the acquired setting information in the storage unit in response to reception of a backup instruction from the communication master by the master-side communication controller, wherein the sensor-side communication controller outputs the setting information stored in the storage unit to the synchronization line via the branch line in response to reception of a restoration instruction from the communication master by the master-side communication controller, wherein the sensor-side communication controller periodically or aperiodically compares the setting information transmitted through the synchronization line with the setting information of the storage unit so as to detect presence or absence of a difference, and wherein the sensor-side communication controller stores the setting information transmitted through the synchronization line in the storage unit in response to detection of the difference.

* * * * *